(12) United States Patent
Wang et al.

(10) Patent No.: US 8,058,134 B2
(45) Date of Patent: Nov. 15, 2011

(54) JUNCTION PROFILE ENGINEERING USING STAGED THERMAL ANNEALING

(75) Inventors: Li-Ting Wang, Tainan (TW);
Keh-Chiang Ku, Sindan (TW);
Yu-Chang Lin, Linkou Shiang (TW);
Nai-Han Cheng, Hsin-Chu (TW);
Li-Ping Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 97 days.

(21) Appl. No.: 12/618,052

(22) Filed: Nov. 13, 2009

(65) Prior Publication Data

US 2010/0210086 A1      Aug. 19, 2010

Related U.S. Application Data

(60) Provisional application No. 61/153,194, filed on Feb. 19, 2009.

(51) Int. Cl.
*H01L 21/336*      (2006.01)
(52) U.S. Cl. .. 438/306; 438/142; 438/305; 257/E21.409
(58) Field of Classification Search .................. 438/151, 438/197, 306; 257/330, E21.409, E21.324, 257/E21.336
See application file for complete search history.

(56) References Cited

U.S. PATENT DOCUMENTS

| 6,044,203 | A | 3/2000 | Dawson et al. |
| 7,026,229 | B2 * | 4/2006 | Downey et al. ............... 438/530 |
| 7,223,660 | B2 | 5/2007 | Hwang |
| 2002/0119587 | A1 * | 8/2002 | Tsai et al. ........................ 438/46 |
| 2004/0053457 | A1 * | 3/2004 | Sohn ............................. 438/197 |
| 2006/0199345 | A1 * | 9/2006 | Mineji ........................... 438/305 |
| 2009/0140351 | A1 * | 6/2009 | Lin et al. ...................... 257/407 |

OTHER PUBLICATIONS

Sharp, J.A., et al., "Deactivation of Ultrashallow Boron Implants in Preamorphized Silicon After Nonmelt Laser Annealing with Multiple Scans," Applied Physics Letters, 2006, 3 pages, vol. 89.

* cited by examiner

*Primary Examiner* — Charles Garber
*Assistant Examiner* — Abdulfattah Mustapha
(74) *Attorney, Agent, or Firm* — Slater & Matsil, L.L.P.

(57) ABSTRACT

An annealing method includes performing an activation annealing on a wafer with a peak temperature of greater than about 1200° C., wherein the activation annealing has a first duration; and performing a defect-recovery annealing on the wafer at a defect-recovery temperature lower than the peak temperature for a second duration. The second duration is longer than the first duration. The annealing method includes no additional annealing steps at temperatures greater than about 1200° C., and no room-temperature cooling step exists between the activation annealing and the defect-recovery annealing.

26 Claims, 3 Drawing Sheets

JUNCTION PROFILE ENGINEERING USING STAGED THERMAL ANNEALING

This application claims the benefit of U.S. Provisional Application No. 61/153,914 filed on Feb. 19, 2009, entitled "Junction Profile Engineering Using Staged Thermal Annealing," which application is hereby incorporated herein by reference.

TECHNICAL FIELD

This invention relates generally to semiconductor devices, and more particularly to the thermal annealing of source and drain junctions, and even more particularly to methods for improving activation rates and reducing the diffusion of implanted ions in source and drain regions.

BACKGROUND

Metal-oxide-semiconductor (MOS) devices include source and drain regions, which are often formed by implantations. After the implantations, an anneal step(s) needs to be performed. The annealing step has several functions. First, the ions introduced into the source and drain regions need to be activated to reduce the series' resistances in the source and drain regions. Second, the implantation causes the destruction of the lattice structures in the source and drain regions and hence defects are generated. The annealing step thus has the function of recovering the lattice structure and reducing the number of defects (referred to as defect recovery hereinafter).

FIG. 1 illustrates a cross-sectional view of a MOS device, as implanted, including gate dielectric 12 over substrate 10, gate electrode 14 over gate dielectric 12, lightly-doped source/drain (LDD) regions 16, and deep source/drain regions 18. As implanted, the edges of LDD regions 16 are vertically aligned to the edges of gate electrode 14.

FIG. 2 illustrates the cross-sectional view of a MOS device after the annealing step is performed. There have been various annealing methods explored to achieve the intended effect. Among these methods, an annealing method combining rapid thermal annealing (RTA) and microsecond annealing was commonly used. For example, the RTA is first performed; the wafer is then cooled down to room temperature, followed by a microsecond annealing. The RTA is performed at a relatively lower temperature for a longer time, while the microsecond annealing is performed at a relative higher temperature for a shorter time. The RTA is used for the defect-recovery purpose due to its relatively long time and the microsecond annealing is for improving the activation rate due to its relatively high temperature. However, the RTA, also due to its relatively long time, causes the diffusion of the implanted ions. As a result, as shown in FIG. 2, LDD regions 16 extend into the channel region under gate electrode 14. This causes the difficulty in the short-channel control. The problem becomes even more severe with the increasing down-scaling of integrated circuits, which causes the channel regions of the MOS devices to be increasingly shorter, and hence the diffuse length becomes an increasingly greater portion of the channel length. It is noted that the RTA is important in the annealing. Without the RTA, the defects, as symbolized by the "x" marks in FIG. 1, will remain after the annealing step, with the defects having a high concentration at the interface between substrate 10 and LDD regions 16, and at the interface between substrate 10 and deep source/drain regions 18.

Temperature and duration are two primary factors affecting the results of the annealing and can be manipulated into many combinations in different annealing methods. For example, an annealing method may include several annealing temperatures, each having a duration different from others. Further, many existing annealing methods can be combined. Unfortunately, the results of all these annealing temperatures and durations, when combined, may enhance or degrade each other. Accordingly, the optimum methods (recipes) are still being explored and improved.

SUMMARY OF THE INVENTION

In accordance with one embodiment of the present invention, an annealing method includes performing an activation annealing on a wafer with a peak temperature greater than about 1200° C., wherein the activation annealing has a first duration; and performing a defect-recovery annealing on the wafer at a defect-recovery temperature lower than the peak temperature for a second duration. The second duration is longer than the first duration. The annealing method includes no additional annealing stages at temperatures greater than about 1200° C., and no room-temperature cooling step exists between the activation annealing and the defect-recovery annealing. Other embodiments are also disclosed.

The advantageous features of the present invention include increased activation rate, reduced diffusion, and high throughput in the annealing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the illustrative embodiments are discussed in detail below. It should be appreciated, however, that the illustrative embodiments provide many applicable inventive concepts that can be embodied in a wide variety of specific contexts. The specific embodiments discussed are merely illustrative of specific ways to make and use the invention and do not limit the scope of the invention.

A novel method for forming and annealing a metal-oxide-semiconductor (MOS) device, which results in an increased activation rate of implanted ions and an improved junction profile in the MOS device is provided. The variations of the embodiments of the present invention are then discussed.

Throughout the various views and illustrative embodiments of the present invention, like reference numbers are used to designate like elements.

Figure 1:
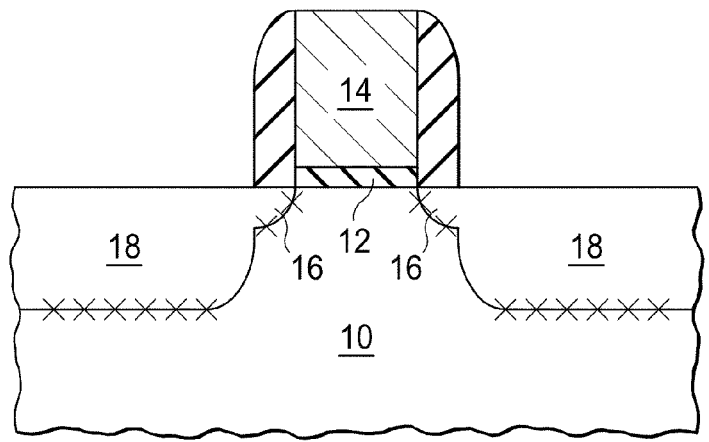
FIG. 1 illustrates cross-sectional view of a device after lightly doped source and drain regions and deep source and drain regions are implanted.
Figure 2:
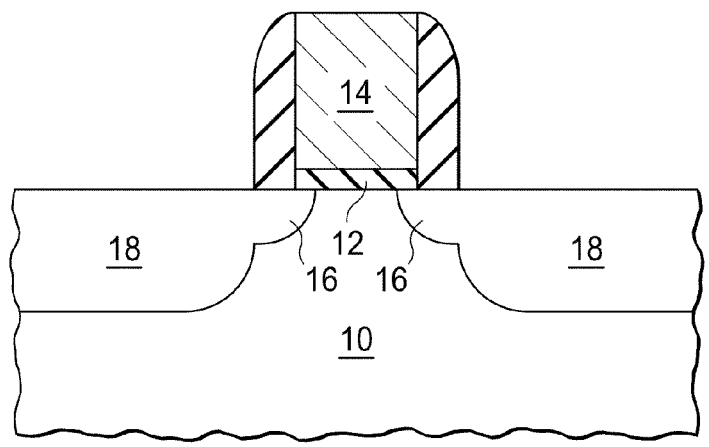
FIG. 2 illustrates the cross-sectional view of a device after an annealing step is performed.
Figure 3:
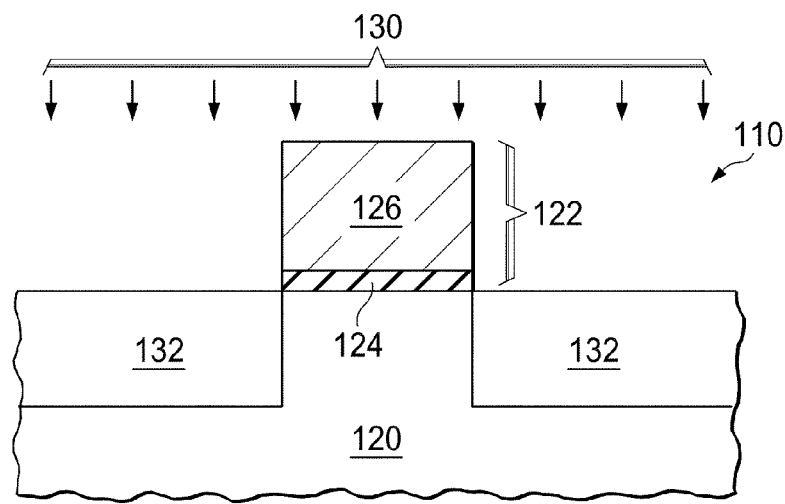
FIGS. 3 through 6 illustrate cross-sectional views of intermediate stages in the manufacturing of a metal-oxide-semiconductor (MOS) device.

FIGS. 3 through 6 illustrate the formation of a metal-oxide-semiconductor (MOS) device, which may be a p-type MOS (PMOS) device or an n-type MOS (NMOS) device. FIG. 3 illustrates wafer 110, substrate 120, and gate structure 122 formed on substrate 120. Substrate 120 may be formed of commonly used substrate materials and structures such as silicon, SiGe, strained silicon on SiGe, silicon on insulator (SOI), silicon germanium on insulator (SGOI), germanium on insulator (GOI), and the like. Gate structure 122 includes gate dielectric 124 and gate electrode 126 on gate dielectric 124. Gate dielectric 124 may be formed of silicon oxide or a high-k dielectric material. Gate electrode 126 may be formed of polysilicon, metals or metal silicides, metal nitrides, or the like.

A pre-amorphized implantation (PAI), as symbolized by arrows 130, is performed to form amorphized regions 132, which has the function of reducing the dopant channeling effect and to enhance dopant activation. In an embodiment, silicon or germanium is implanted. In other embodiments, inert gases, such as neon, argon, krypton, xenon, and radon, are used. The PAI increase the number of vacancies in substrate 120 and can prevent subsequently doped impurities from channeling through spaces between the crystal lattice structure and reaching depths greater than desired. At least a top portion of (polysilicon) gate electrode 126 and exposed portions of (single crystalline) substrate 120 are turned into an amorphous state as a result of the PAI.

Figure 4:
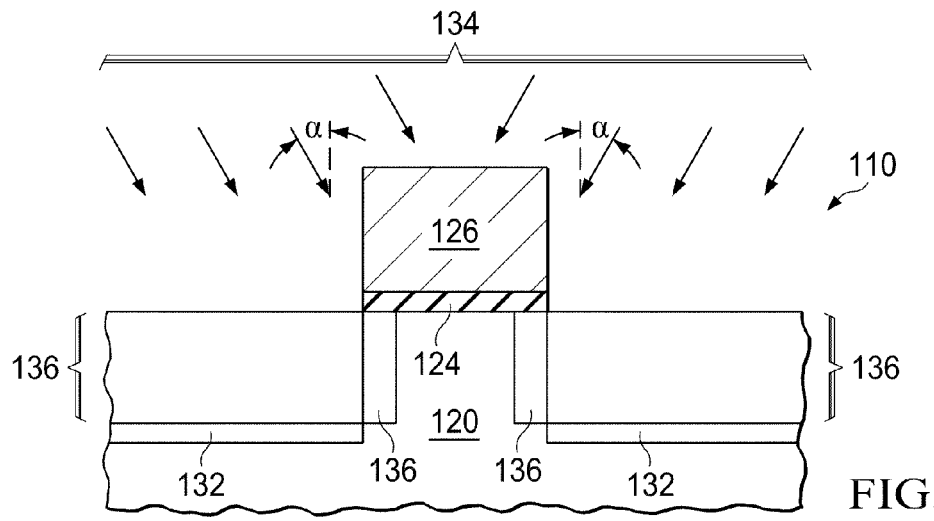

FIG. 4 illustrates the optional implanting of diffusion-retarding impurities, which may comprise carbon, fluorine, nitrogen, and combinations thereof. The implantation is symbolized by arrows 134, and may be either vertical or tilted, or include a vertical implantation(s) and a tilted implantation(s). The tilt angle α is greater than zero degrees and may be less than about 50 degrees. In an embodiment, two tilted implantations may be performed, with one tilting toward the other, and thus forming diffusion-retarding regions 136. With tilt implantations, diffusion-retarding regions 136 extend under gate electrode 126, and thus the resulting source/drain extension regions (not shown in FIG. 4, please refer to FIGS. 5 and 6) may be shallower and sharper. The dose of the diffusion-retarding elements may be between about $1E14/cm^2$ and about $1E16/cm^2$, although greater or lesser doses may be used.

Figure 5:
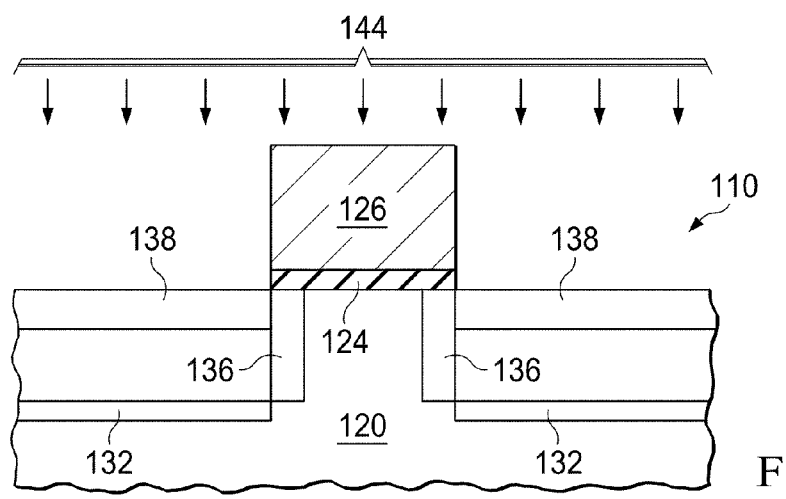

FIG. 5 illustrates the implantation of source and drain extension regions (referred to as source/drain extension regions hereinafter) 138. In an embodiment, the resulting MOS device is a PMOS device, and hence p-type impurities, such as boron, $BF_2$, indium, and the like, may be implanted. In alternative embodiments, the resulting MOS device is an NMOS device, and hence may be implanted with n-type impurities, such as arsenic and phosphorus. Arrows 144 symbolize the implanting, which may be substantially vertical. Source/drain extension regions 138 may extend under gate electrode 126 less than diffusion-retarding regions 136. Therefore, the diffusion of source/drain extension regions 138 is retarded effectively by diffusion-retarding regions 136. To reduce the depth of source/drain extension regions 138, the implanting of source/drain extension regions 138 may be performed using a low energy. Although not shown, pocket/halo regions may also be formed, wherein the pocket/halo regions have an opposite conductivity type as that of source/drain extension regions 138. An optional LDD dopant activation may also be performed.

Figure 6:
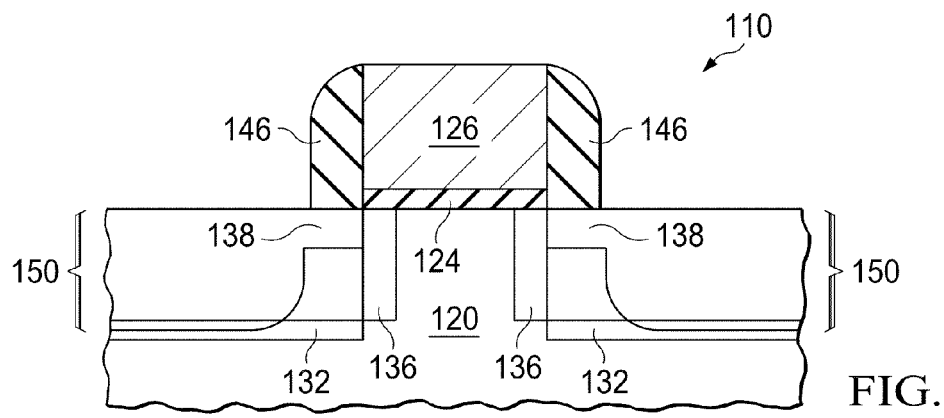

FIG. 6 illustrates the formation of spacers 146 and heavily doped source/drain (HDD) regions 150. A pair of spacers 146 is formed along the sidewalls of the gate dielectric 124 and gate electrode 126. As is known in the art, spacers 146 may be formed by blanket depositing a dielectric layer over an entire region, then anisotropically etched so that the horizontal portions of the dielectric layer are removed, while spacers 146 are left un-removed. Spacers 146 are used as masks for the formation of the HDD regions 150. If the intended MOS device is an NMOS device, n-type impurities, such as arsenic and phosphorus, may be implanted in the formation of HDD regions 150. Otherwise, if the intended MOS device is a PMOS device, p-type impurities, such as boron, indium, and combinations thereof may be implanted.

To have an optimized effect, diffusion-retarding regions 136 may enclose source/drain extension regions 138, and HDD regions 150, and possibly pocket/halo regions from both the bottom side and the side closest to the channel region. With the formation of amorphized regions 132 and diffusion-retarding regions 136, the diffusion of the implanted p-type and/or n-type elements is reduced, and hence resulting source/drain extension regions 138 and HDD regions 150 have a sharp profile.

Figure 7:
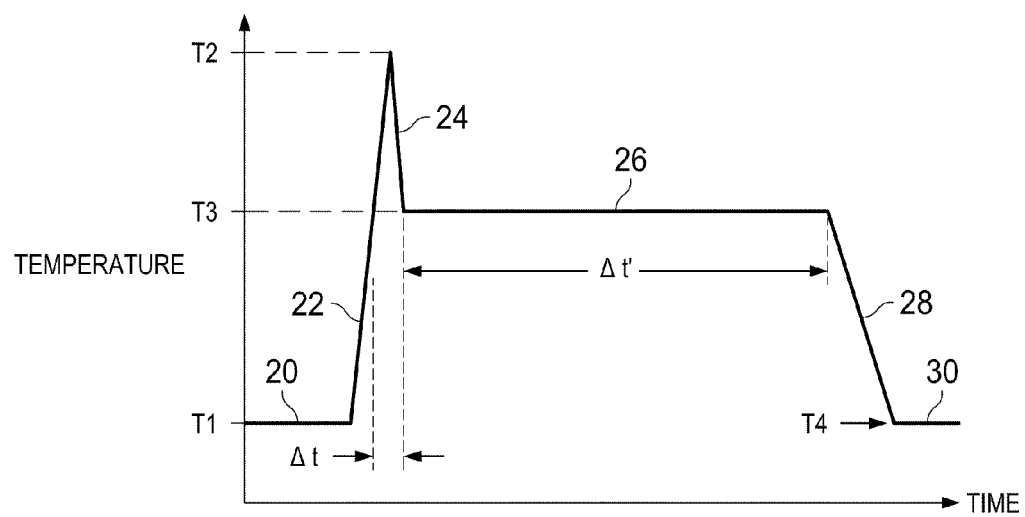
FIG. 7 shows an annealing performed to the MOS device as shown in FIG. 6, wherein the annealing temperature on a surface of a wafer is illustrated as a function of time in accordance with an embodiment.
Figure 8:
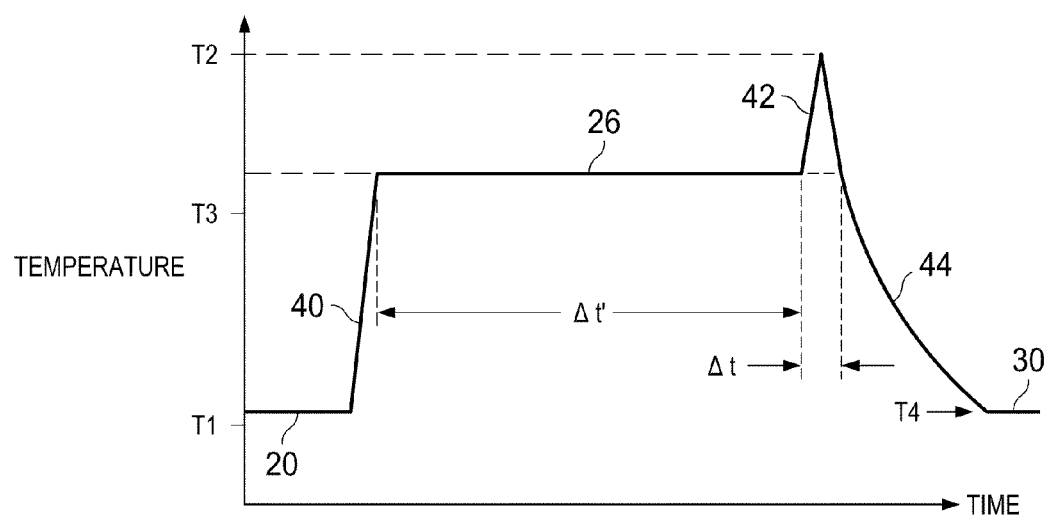
FIG. 8 shows an alternative annealing performed to the MOS device, in which an activation annealing and a defect-recovery annealing have a reversed order as shown in FIG. 7 in accordance with an embodiment.

FIGS. 7 and 8 illustrate the activation (annealing) of source/drain extension regions 138 and HDD regions 150, wherein the surface temperature of wafer 100 containing the MOS device is shown as a function of time. Wafer 110 may include both NMOS and PMOS devices formed by the methods in the steps as shown in FIGS. 3 through 6. At the time the annealing steps in the embodiments of the present invention are performed, the source/drain regions and/or the source/drain extension regions are exposed. Accordingly, the temperature at the surface of the wafer is also at least substantially equal to the temperatures of the source/drain regions and source/drain extension regions.

In an embodiment of the present invention, an annealing of the wafer is performed using an energy source that has the capability of ramping up the temperature at the surface of the wafer rapidly, as will be discussed in detail in subsequent paragraphs. An exemplary energy source is a flash lamp, although other energy sources may also be used. Further, the energy source needs to be able to turn off the radiation on the wafer rapidly, for example, in less than 1 millisecond, or even in microseconds.

Referring to FIG. 7, the annealing step may include pre-heating (annealing) stage 20. In an embodiment, pre-heating stage 20 has a duration of one second or longer. Pre-heating temperature T1 may be less than about 600° C., for example, between about 400° C. and about 500° C. Temperature T1 may also be less than about 450° C., for example, between about 400° C. and 450° C., or even equal to or slightly less than 400° C. The pre-heat stage 20 may be omitted, and the resulting annealing may start from room temperature directly into the defect-recovering annealing or the activation annealing, as will be discussed in subsequent paragraphs. However, it is advantageous to have pre-heating stage 20, during which both the surface and the substrate of wafer 110 (not only the surface of wafer 110) are heated. This may reduce the stress generated in the subsequent activation anneal due to the reduced difference between the high-temperature at the wafer surface and the relatively low-temperature in the substrate.

Temperature T1 of the pre-heating stage is generally lower than 600° C. Contrary to the conventional wisdom, if temperature T1 of the pre-heating stage is 500° C. or even 600° C., the activation rate of the source/drain regions will be degraded, instead of being improved.

After the pre-heating stage, an activation stage is performed. Throughout the description, the period of time that the wafer surface temperature is higher than the subsequently discussed defect-recovery temperature is referred to as an activation annealing stage. The surface of wafer 110 is rapidly ramped up to peak temperature T2, which in an embodiment is higher than about 1200° C., and in other embodiments between about 1200° C. and about 1300° C. In ramp-up stage 22, the ramp up rate is greater than about 1E5 degrees (Celsius)/second, for example, between about 1E5 degrees (Celsius)/second and about 1E6 degrees (Celsius)/second, or even higher. The ramp-up rate may also be as high as possible, depending on the capability of the energy source. In an embodiment, after peak temperature T2 is reached, the wafer surface temperature may stay at temperature T2 briefly, for example, for less than about 1 millisecond, before the temperature ramps down (stage 24). In alternative embodiments, as soon as peak temperature T2 is reached, the wafer surface temperature starts ramping down. In other words, the wafer surface temperature stays at temperature T2 for less than about 1 millisecond.

After peak temperature T2 is reached, the wafer surface temperature is ramped down, as indicated by ramp-down stage 24. The ramp down rate of ramp-down stage 24 depends on the heat-dissipating rate, and, in an embodiment, is as high as possible. In this stage, the energy source completely stops radiating energy to wafer 110. In an exemplary embodiment, the ramp down rate is greater than about 1E4 degrees (Celsius)/second.

The activation annealing stage is short enough so that the diffusion of the implanted ions is minimized. Generally, duration $\Delta t$ of the activation annealing, which may be measured from the time that the wafer surface temperature ramps up to higher than the subsequent discussed defect-recovery temperature to the time the wafer surface temperature ramps down to reach the defect-recovery temperature, is less than about 2 milliseconds, and in various embodiments is about 1 millisecond. Alternatively, if feasible, duration $\Delta t$ may be measured starting from the time the wafer surface temperature is higher than 1000° C. to the time the wafer surface temperature drops back to 1000° C. Duration $\Delta t$ may also be less than 1 millisecond. Although temperature T2 is determined so that the activation rate of the implanted ions at temperature T2 is high, and temperature T2 may be in the range that a high degree of ion diffusion may occur, since duration $\Delta t$ is short, the actual diffusion of the implanted ions is not significant.

Ramp-down stage 24 finishes when the wafer surface temperature reaches temperature T3. At which time, the annealing step goes into stage 26 (referred to as a defect-recovery stage hereinafter). During defect-recovery stage 26, wafer surface temperature T3 (referred to as defect-recovery temperature hereinafter) is relatively stable, for example, with a temperature variation less than about 100° C., and in various embodiments less than about 50° C. Further, temperature T3 may be greater than about 800° C., and even greater than about 1000° C., and even between about 1000° C. and about 1200° C. Further, temperature T3 is lower than temperature T2 by, for example, greater than about 100° C., and in various embodiments between about 100° C. and about 200° C. It is realized that temperatures T2 and T3 may vary, for example, depending on the material of the substrate of wafer 110, and the type of ions. Accordingly, for the ions that are less prone to diffusion, temperatures T2 and/or T3 may be higher, while for the ions that are prone to diffusion, temperatures T2 and/or T3 may be lower.

Duration $\Delta t'$ of defect-recovery stage 26 is long enough to allow the defect recovery to occur, but short enough so that no significant diffusion of the implanted ions occur. In an embodiment, duration $\Delta t'$ is greater than about 20 milliseconds and less than about 100 milliseconds. Between the activation annealing stage and defect-recovery stage 26, no room-temperature cool down (which means the temperature of wafer 110 is cooled to room temperature, or a temperature no more than 20° C. above room temperature) occurs.

Overall, duration $\Delta t$ and temperature T2 in combination are critical to improving the activation rate without causing a high diffusion rate, and duration $\Delta t'$ and temperature T3 in combination are critical to reducing the defects without causing significant diffusion. Therefore, the combinations of the above-discussed durations $\Delta t$ and $\Delta t'$ and temperatures T2 and T3 may result in a high activation rate and a low diffusion.

After defect-recovery stage 26, ramp-down stage 28 begins, during which the wafer surface temperature is reduced to post-anneal temperature T4. In an embodiment, the ramp-down rate of the wafer surface temperature is as high as possible. However, the ramp-down rate in ramp-down stage 28 is limited by the heat-dissipating rate of wafer 110, particularly if the substrate of the wafer already has a temperature equal to temperature T1 or higher. Further, in an embodiment, the wafer surface temperature passes through the temperature range of 600° C.-800° C. as fast as possible to reduce the adverse effect to the activation rate, since annealing wafer 110 in this temperature range degrades the activation rate. Accordingly, during ramp-down stage 28, the radiation of the energy source is completely turned off. Next, stage 30 may be performed, during which temperature T4 of wafer 110 stays in a similar range as temperature T1 discussed in the preceding paragraphs, for example, close to about 400° C.

It is realized that in anneals, the factors, such as the above-discussed temperatures T1, T2, and T3, and durations $\Delta t$ and $\Delta t'$, all have effects on the resulting activation rate and diffusion length of the implanted ions.

FIG. 8 illustrates an alternative embodiment, which is similar to the embodiment shown in FIG. 7, except defect-recovery stage 26 is performed before the activation annealing. Like stages in FIGS. 7 and 8 (denoted using like reference numbers), are essentially the same, and hence are not repeated herein. The values of temperatures T1, T2, T3 and T4, and durations $\Delta t$ and $\Delta t'$ may also be the same as in the embodiment discussed in preceding paragraphs. Between stages 20 and 26, there is ramp-up stage 40, which may have essentially the same ramp-up rate as stage 22 in FIG. 7. Ramp-up stage 42 may also have a similar ramp up rate as in ramp-up stage 40. Ramp-down stage 44 may have a high ramp-down rate that is determined by the heat-dissipating ability of wafer 110. Again, between the activation annealing stage and defect-recovery stage 26, no room-temperature cool down occurs.

By using the annealing methods of the present invention, the activation rate is significantly improved. The samples annealed by the annealing methods of the present invention have steadily achieved less than 600 ohm/square sheet resistance in source and drain regions, while similar samples annealed using other conventional annealing methods have at least 650 ohm/square sheet resistance, with the sheet resistances of most samples being 750 ohm/square or above. In the resulting MOS device formed using the method illustrated in FIGS. 3 through 6, due to the formation of the PAI regions and the diffusion-retarding regions, and the low energy used in the implantation of source/drain extension regions, the junction depth of the source/drain extension regions and HDD regions may be further reduced, resulting in reduced sheet resistances in these regions.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method for forming an integrated circuit on a wafer, the method comprising:
    performing an activation annealing on the wafer with a peak temperature of greater than about 1200° C., wherein the activation annealing has a first duration; and
    performing a defect-recovery annealing on the wafer at a defect-recovery temperature lower than the peak temperature for a second duration longer than the first duration, wherein no room-temperature cooling step exists between the activation annealing and the defect-recovery annealing.

2. The method of claim 1, wherein the first duration is less than about 2 milliseconds.

3. The method of claim 1, wherein the defect-recovery annealing has a temperature variation smaller than about 100° C.

4. The method of claim 1, wherein the second duration is between about 20 milliseconds and about 100 milliseconds, and wherein the defect-recovery temperature is lower than the peak temperature by greater than about 100° C.

5. The method of claim 1, wherein the step of performing the activation annealing comprises a ramp-up stage having a ramp-up rate of greater than about 1E5 degrees (Celsius)/second.

6. The method of claim 1 further comprising a pre-heating annealing at a temperature of lower than about 450° C., and a post-annealing step at a temperature of lower than about 450° C.

7. The method of claim 1, wherein the activation annealing is before the defect-recovery annealing.

8. The method of claim 1, wherein the activation annealing is after the defect-recovery annealing.

9. The method of claim 1 further comprising, before the step of performing the activation annealing and the step of performing the defect-recovery annealing, forming a metal-oxide-semiconductor (MOS) device on the wafer comprising:
    forming a gate structure on a substrate of the wafer;
    performing a pre-amorphized implantation (PAI) to the substrate and adjacent the gate structure;
    forming a diffusion-retarding region in the substrate and adjacent the gate structure; and
    forming a source/drain extension region in the substrate and substantially contained by the diffusion-retarding region.

10. The method of claim 9, wherein the step of forming the diffusion-retarding region comprises implanting carbon.

11. The method of claim 9, wherein the step of forming the source/drain extension region comprises implanting boron.

12. The method of claim 9, wherein the step of forming the source/drain extension region comprises implanting phosphorous.

13. A method for forming an integrated circuit on a wafer, the method comprising:
    performing a pre-heat annealing at a pre-heating temperature lower than about 450° C.;
    starting from the pre-heating temperature, ramping up a surface temperature of the wafer to perform an activation annealing on the wafer, wherein the activation annealing has a peak temperature of higher than about 1200° C. and a first duration of less than about 2 milliseconds;
    immediately after the step of performing the activation annealing, ramping down the surface temperature of the wafer to a defect-recovery temperature lower than the peak temperature, wherein the defect-recovery temperature is between about 800° C. and about 1200° C.;
    performing a defect-recovery annealing on the wafer at the defect-recovery temperature for a second duration between about 20 milliseconds and about 100 milliseconds, wherein the defect-recovery temperature has a variation less than about 100° C.; and
    ramping down the surface temperature of the wafer from the defect-recovery temperature to a post-annealing temperature lower than about 450° C.

14. The method of claim 13, wherein the defect-recovery temperature is lower than the peak temperature by greater than about 100° C., and wherein the first duration is measured starting from when the surface temperature rises above 1000° C. to when the surface temperature drops back to 1000° C.

15. The method of claim 13, wherein the defect-recovery temperature has a variation less than about 50° C.

16. The method of claim 13, wherein the defect-recovery temperature is between about 800° C. and about 1100° C.

17. The method of claim 13, wherein the first duration is about 1 millisecond.

18. The method of claim 13, wherein the step of ramping up the surface temperature of the wafer has a ramp-up rate of greater than about 1E5 degrees (Celsius)/second.

19. The method of claim 13 further comprising, before the step of performing the activation annealing and the step of performing the defect-recovery annealing, forming a metal-oxide-semiconductor (MOS) device on the wafer comprising:
    forming a gate structure on a substrate of the wafer;
    performing a pre-amorphized implantation (PAT) comprising germanium to the substrate and adjacent the gate structure;
    forming a diffusion-retarding region comprising carbon in the substrate and adjacent the gate structure; and
    forming a source/drain extension region in the substrate and substantially contained by the diffusion-retarding region, wherein the source/drain extension region comprises an element selected from a group consisting essentially of boron and phosphorous.

20. A method for forming an integrated circuit on a wafer, the method comprising:
    performing a pre-heat annealing at a pre-heating temperature lower than about 450° C.;

starting from the pre-heating temperature, ramping up a surface temperature of the wafer to a defect-recovery temperature between about 800° C. and about 1200° C.;

performing a defect-recovery annealing on the wafer at the defect-recovery temperature for a first duration between about 20 milliseconds and about 100 milliseconds, and wherein the defect-recovery temperature has a variation less than about 100° C.;

starting from the defect-recovery temperature, ramping up the surface temperature of the wafer to a peak temperature of greater than about 1200° C. to perform an activation annealing, wherein the activation annealing has a second duration of less than about 2 milliseconds; and immediately after the activation annealing, ramping down the surface temperature of the wafer to a post-annealing temperature lower than about 450° C.

21. The method of claim 20, wherein the defect-recovery temperature is lower than the peak temperature by greater than about 100° C., and wherein the second duration is measured starting from when the surface temperature rises above 1000° C. to when the surface temperature drops back to 1000° C.

22. The method of claim 20, wherein the defect-recovery temperature is between about 1000° C. and about 1100° C.

23. The method of claim 20, wherein the second duration is about 1 millisecond.

24. The method of claim 20, wherein the step of ramping up the surface temperature of the wafer to the defect-recovery temperature and the step of ramping up the surface temperature of the wafer to the peak temperature have a ramp-up rate of greater than about 1E5 degrees (Celsius)/second.

25. The method of claim 20, wherein the defect-recovery temperature has a variation less than about 50° C.

26. The method of claim 20 further comprising, before the step of performing the activation annealing and the step of performing the defect-recovery annealing, forming a metal-oxide-semiconductor (MOS) device on the wafer comprising:

forming a gate structure on a substrate of the wafer;

performing a pre-amorphized implantation (PAI) comprising germanium to the substrate and adjacent the gate structure;

forming a diffusion-retarding region comprising carbon in the substrate and adjacent the gate structure; and forming a source/drain extension region in the substrate and substantially contained by the diffusion-retarding region, wherein the source/drain extension region comprises an element selected from a group consisting essentially of boron and phosphorous.

* * * * *

UNITED STATES PATENT AND TRADEMARK OFFICE
CERTIFICATE OF CORRECTION

Page 1 of 1

PATENT NO. : 8,058,134 B2
APPLICATION NO. : 12/618052
DATED : November 15, 2011
INVENTOR(S) : Wang et al.

It is certified that error appears in the above-identified patent and that said Letters Patent is hereby corrected as shown below:

On the Title Page, item (60) Related U.S. Application Data, delete "61/153,194" and insert --61/153,914--.

In Col. 8, line 54, claim 19, delete "(PAT)" and insert --(PAI)--.

Signed and Sealed this
Thirteenth Day of March, 2012

David J. Kappos
*Director of the United States Patent and Trademark Office*